(12) United States Patent
Gu

(10) Patent No.: US 11,264,593 B2
(45) Date of Patent: Mar. 1, 2022

(54) FLEXIBLE DISPLAY DEVICE

(71) Applicant: KunShan Go-Visionox Opto-Electronics Co., Ltd., Kunshan (CN)

(72) Inventor: Yu Gu, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/516,965

(22) Filed: Jul. 19, 2019

(65) Prior Publication Data

US 2019/0341580 A1    Nov. 7, 2019

Related U.S. Application Data

(63) Continuation of application No. PCT/CN2018/088409, filed on May 25, 2018.

(30) Foreign Application Priority Data

Aug. 31, 2017   (CN) .......................... 201710773123.2

(51) Int. Cl.
*H01L 35/24*   (2006.01)
*H01L 51/00*   (2006.01)
(Continued)

(52) U.S. Cl.
CPC ...... *H01L 51/5253* (2013.01); *H01L 51/0097* (2013.01); *H01L 2251/5338* (2013.01)

(58) Field of Classification Search
CPC ....... H01L 25/046; H01L 27/28; H01L 51/00; H01L 2031/0344; H01L 2251/00;
(Continued)

(56) References Cited

U.S. PATENT DOCUMENTS

2014/0312322 A1* 10/2014 Jeong .................... H01L 51/524
257/40
2015/0036299 A1   2/2015 Namkung et al.
(Continued)

FOREIGN PATENT DOCUMENTS

CN     103682154 A    3/2014
CN     104112401 A   10/2014
(Continued)

OTHER PUBLICATIONS

PCT International Search Report dated Jul. 15, 2018 in International Application No. PCT/CN2018/088409.
(Continued)

*Primary Examiner* — Luan C Thai
*Assistant Examiner* — Dilinh P Nguyen
(74) *Attorney, Agent, or Firm* — Rimon, P.C.

(57) ABSTRACT

A flexible display device and a method for manufacturing the flexible display device are provided by embodiments of the present application, which solve problems that a module of a flexible active-matrix organic light emitting diode has a poor moisture and oxygen blocking effect on a side, and an edge is prone to fracture or be peeled off when bent. A flexible display device provided by an embodiment of the application includes a display substrate, and an encapsulating film layer disposed on a surface of the display substrate. An edge of the encapsulating film layer includes a concave-convex sawtooth structure.

9 Claims, 3 Drawing Sheets

(51) Int. Cl.
  *H01L 23/48* (2006.01)
  *H01L 23/52* (2006.01)
  *H01L 51/52* (2006.01)
(58) Field of Classification Search
  CPC ..... H01L 21/56; H01L 23/28; H01L 31/0203; H01L 31/048; H01L 33/52
  USPC .................................................. 257/40, 787
  See application file for complete search history.

(56) References Cited

U.S. PATENT DOCUMENTS

| | | | | |
|---|---|---|---|---|
| 2015/0357597 | A1* | 12/2015 | Wang | ................ H01L 51/0097 257/40 |
| 2019/0165308 | A1* | 5/2019 | Li | ...................... H01L 27/3223 |

FOREIGN PATENT DOCUMENTS

| | | |
|---|---|---|
| CN | 104425760 A | 3/2015 |
| CN | 105633298 A | 6/2016 |
| CN | 105932175 A | 9/2016 |
| CN | 205789979 U | 12/2016 |
| CN | 106816456 A | 6/2017 |
| CN | 106847760 A | 6/2017 |
| CN | 106847869 A | 6/2017 |
| CN | 106848088 A | 6/2017 |
| CN | 106848107 A | 6/2017 |
| TW | 200700800 A | 1/2007 |
| TW | 201110281 A | 3/2011 |
| TW | 201442224 A | 11/2014 |
| TW | 200528829 A | 9/2015 |

OTHER PUBLICATIONS

Chinese Patent Office, First Office Action for CN Application No. 201710773123.2 dated Aug. 1, 2019.
Chinese Refusal Decision for CN Application No. 201710773123.2 dated Apr. 6, 2021.

* cited by examiner

FLEXIBLE DISPLAY DEVICE

CROSS-REFERENCE TO RELATED APPLICATIONS

This application is a continuation application of International Application No. PCT/CN2018/088409 filed on May 25, 2018, which claims priority to Chinese patent application No. 201710773123.2 filed on Aug. 31, 2017. Both applications are incorporated herein by reference in their entireties.

TECHNICAL FIELD

Exemplary embodiments of the present application relate to display technologies, and in particular to a flexible display device and a method for manufacturing the flexible display device.

BACKGROUND

At present, in a display device, a flexible Active-Matrix Organic Light Emitting Diode (AMOLED) has become a hot spot for current high-end smart products. Since the flexible active-matrix organic light emitting diode has a wider viewing angle, a higher refresh rate, and a thinner size than the conventional liquid crystal display used in most mobile phones, a visual experience is improved, an operation speed is improved, and a weight of the mobile phone is reduced.

Generally, a thin film encapsulation process is adopted in a module of the flexible active-matrix organic light emitting diode to enhance moisture and oxygen blocking performance, but the moisture and oxygen blocking effect on a side is not good. Because of brittleness of an inorganic material used in encapsulation film, an edge of the encapsulation film is prone to fracture or be peeled off when bent, consequently the moisture and oxygen blocking effect and reliability of the module may be affected.

SUMMARY

In view of the above, exemplary embodiments of the present application provide a flexible display device and a method for manufacturing the flexible display device, which solve problems that a module of a flexible active-matrix organic light emitting diode has a poor moisture and oxygen blocking effect on a side, and an edge is prone to fracture or be peeled off when bent.

A flexible display device according to an embodiment of the present application includes a display substrate; and an encapsulating film layer disposed on a surface of the display substrate. An edge of the encapsulating film layer includes a concave-convex sawtooth structure.

In an embodiment, the sawtooth structure is located at a predetermined bending region of a circumferential edge of the encapsulating film layer; or the sawtooth structure is distributed over an entire circumferential edge of the encapsulating film layer.

In an embodiment, a sawtooth in the sawtooth structure has a semicircle shape, a triangle shape or a rectangle shape.

In an embodiment, distances between the sawteeth in the sawtooth structure are equal.

In an embodiment, the flexible display device further includes a moisture and oxygen blocking layer disposed on a surface of the encapsulating film layer and covering the surface of the display substrate exposed by the sawtooth structure of the circumferential edge of the encapsulating film layer.

In an embodiment, the moisture and oxygen blocking layer is a transparent optical adhesive layer.

In an embodiment, the flexible display device further includes a touch sensing layer disposed on a surface of the optical adhesive layer; or, a polarizer layer disposed on a surface of the optical adhesive layer.

In an embodiment, a horizontal cross sectional area of the touch sensing layer or the polarizer layer is equal to a horizontal cross sectional area of the optical adhesive layer.

In an embodiment, the display substrate includes an organic light emitting diode display substrate.

A method for manufacturing a flexible display device according to an embodiment of the present application includes providing a display substrate; providing an encapsulating film layer on a surface of the display substrate; and removing a partial region of a circumferential edge of the encapsulating film layer to form a sawtooth structure.

In an embodiment, the sawtooth structure is located at a predetermined bending region of the circumferential edge of the encapsulating film layer; or, the sawtooth structure is distributed over the entire circumferential edge of the encapsulating film layer.

In an embodiment, the removing a partial region of a circumferential edge of the encapsulating film layer to form a sawtooth structure includes forming a mask layer on a surface of the encapsulating film layer, a shape of the encapsulating film layer exposed by the mask layer corresponding to a shape of the sawtooth structure; and etching the encapsulating film layer exposed by the mask layer.

In an embodiment, the method further includes providing a moisture and oxygen blocking layer on a surface of the encapsulating film layer and the surface of the display substrate exposed by the sawtooth structure.

In an embodiment, the moisture and oxygen blocking layer is a transparent optical adhesive layer, and the method further includes preparing a touch sensing layer or a polarizer layer on a surface of the optical adhesive layer.

In an embodiment, the method further includes a horizontal cross sectional area of the touch sensing layer or the polarizer layer is equal to a horizontal cross sectional area of the optical adhesive layer.

A flexible display device and a method for manufacturing the flexible display device are provided by embodiments of the present application, the edge of the encapsulating film layer is designed as the sawtooth structure. In this way, when the flexible display device is bent, the concave-convex shape of the sawtooth structure of the edge of the encapsulating film layer may play a role of dispersing bending stress, thereby avoiding fracture of the encapsulating film layer, enhancing bending resistance performance of the flexible display device, and due to the moisture and oxygen blocking layer disposed at the sawtooth structure, enhancing the moisture and oxygen blocking capability at the edge of the encapsulating film layer of the flexible display device.

DETAILED DESCRIPTION

The technical solutions in the embodiments of the present application are clearly and completely described in the following with reference to the accompanying drawings in the embodiments of the present application. It is obvious that the described embodiments are only a part of the embodiments of the present application, and not all of the embodiments. All other embodiments obtained by those skilled in the art based on the embodiments of the present application without creative efforts are within the scope of the present application.

Figure 1:
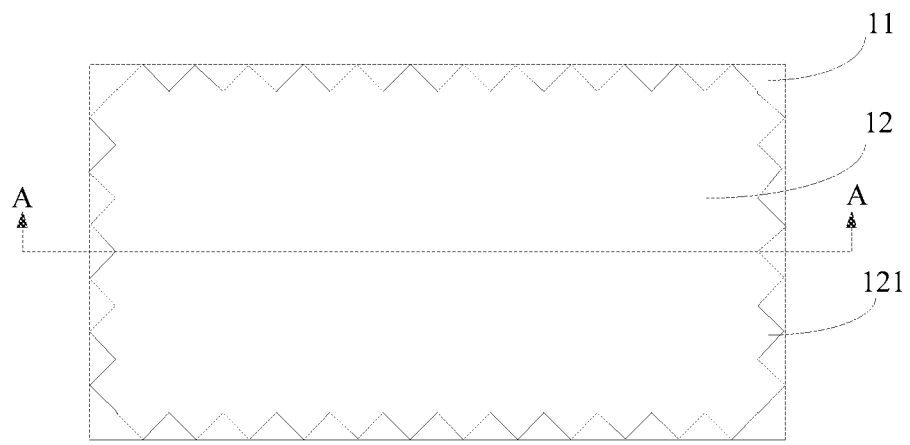
FIG. 1 is a structural diagram of a flexible display device according to an embodiment of the present application.

FIG. 1 is a structural diagram of a flexible display device according to an embodiment of the present application. As shown in FIG. 1, the flexible display device includes a display substrate 11 and an encapsulating film layer 12 disposed on a surface of the display substrate 11. An edge of the encapsulating film layer 12 includes a concave-convex sawtooth structure 121.

The display substrate 11 may be an organic light emitting diode display substrate 11, and the display substrate 11 may be made of a flexible material. However, it should be understood that the display mode and the material of the display substrate 11 are not limited in the present application. The encapsulating film layer 12 may be prepared on the surface of the display substrate 11 by a thin film encapsulation technique. For example, the encapsulating film layer 12 may be formed by a combination of a plurality of layers of organic-inorganic films. The materials of the encapsulating film layer 12 may be a silicon nitride film, an aluminum oxide film, or the like. The materials of the encapsulating film are not limited in the present application.

It may be seen that due to the existence of the sawtooth structure 121 of the edge of the encapsulating film layer 12, when the flexible display device is bent, a concave-convex shape of the sawtooth structure 121 of the edge of the encapsulating film layer 12 may play a role of dispersing bending stress, thereby avoiding fracture of the encapsulating film layer 12, and enhancing bending resistance performance of the flexible display device.

Figure 2:
FIG. 2 is a diagram of sawtooth shape of an edge of an encapsulating film layer of a flexible display device according to an embodiment of the present application.
Figure 2:
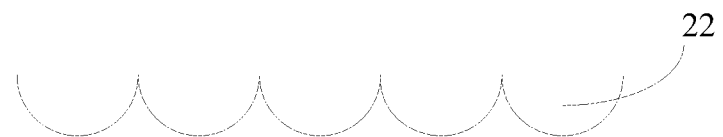
Figure 2:

It should be understood that, as shown in FIG. 2, a sawtooth in the sawtooth structure 121 mentioned above may have a triangle shape 21, a semicircle shape 22 or a rectangle shape 23, and the sawtooth shape in the sawtooth structure 121 is not limited in the present application.

In an embodiment of the present application, the sawtooth structure 121 is located at a predetermined bending region of a circumferential edge of the encapsulating film layer 12 or distributed over an entire circumferential edge of the encapsulating film layer 12. It should be understood, however, that the sawtooth structure 121 may be disposed only at the predetermined bending region of the encapsulating film layer 12, or may be disposed over the entire circumferential edge of the encapsulating film layer 12. For example, when the flexible display device only needs to be bent on one side, only the one side of the encapsulating film layer 12 need to be designed into the sawtooth structure 121, and the rest of the encapsulating film layer 12 may not be provided as the sawtooth structure 121, thereby reducing process burden. The entire circumferential edge of the encapsulating film layer 12 may be designed into the sawtooth structure 121 if each region of the flexible display device may be bent. However, the specific position of the predetermined bending region on the encapsulating film layer 12 is not limited in the present application.

In an embodiment of the present application, each sawtooth in the sawtooth structure 121 has the same shape, and distances between the sawteeth are equal. However, it should be understood that the shape and the distribution distance of the sawteeth in the sawtooth structure 121 may also be determined according to bending requirement degree of the predetermined bending region. For example, when a bending requirement angle of a bending region is relatively large, i.e., only the bending at a large obtuse angle is completed, the sawtooth distance at the bending region may also be relatively large to reduce the process burden. When the bending requirement angle of the bending region is relatively small, i.e., the bending at a small acute angle is completed, the sawtooth distance at the bending region may be tight. However, the sawtooth distance in the sawtooth structure 121 is not limited in the present application.

Figure 3:
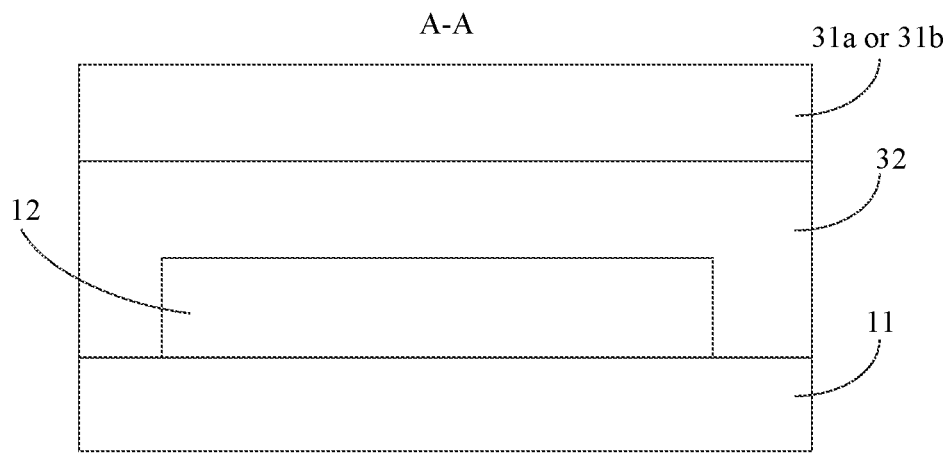
FIG. 3 is a structural diagram of a flexible display device according to an embodiment of the present application.

FIG. 3 is a structural diagram of a flexible display device according to an embodiment of the present application. As shown in FIG. 3, the flexible display device further includes a moisture and oxygen blocking layer 32 having function of isolating moisture and oxygen.

The moisture and oxygen blocking layer 32 is disposed on a surface of the encapsulating film layer 12 and covers a surface of the display substrate 11 exposed by the sawtooth structure of the circumferential edge of the encapsulating film layer 12. In this way, the moisture and oxygen blocking layer 32 is completely wrapped around periphery of the encapsulating film layer 12. Although the edge of the encapsulating film layer 12 includes the concave-convex sawtooth structure 121, only a convex portion of the sawtooth structure 121 may expose outside the moisture and oxygen blocking layer 32, which greatly reduces an area of the encapsulating film layer 12 exposed in the air compared with the prior art, thereby effectively blocking entry of the moisture and oxygen from a side, and improving the moisture and oxygen blocking performance of the flexible display device on the side.

In an embodiment of the present application, the moisture and oxygen blocking layer 32 may be a transparent optical adhesive layer with good transmission performance, so that a display effect of the flexible display device is relatively clear. Since the optical adhesive layer has adhesiveness, the optical adhesive layer may be directly coated on the encapsulating film layer 12 to facilitate process preparation. It should be understood that the moisture and oxygen blocking layer 32 may also adopt other materials having moisture and oxygen blocking performance. The material of the moisture and oxygen blocking layer 32 is not limited in the present application.

In an embodiment of the present application, the flexible display device further includes a touch sensing layer 31a or a polarizer layer 31b disposed on a surface of the optical adhesive layer 32. The touch sensing layer 31a is used to implement a touch operation of the flexible display device, the polarizer layer 31b is used to absorb light in other directions of natural light, and only retain display light in a desired direction to pass through, which improves display quality.

Figure 4:
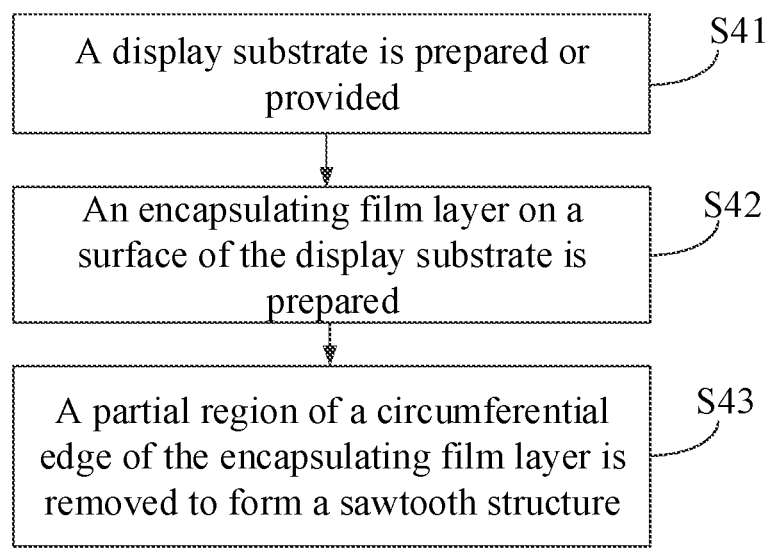
FIG. 4 is a schematic flow chart of a method for manufacturing a flexible display device according to an embodiment of the present application.

FIG. 4 is a schematic flow chart of a method for manufacturing a flexible display device according to an embodiment of the present application. As shown in FIG. 4, the method includes the following steps.

Step 41: a display substrate 11 is prepared or provided.

The display substrate 11 is located at the bottommost layer of the flexible display device and is covered with a semiconductor structure for display. However, it should be understood that the display substrate 11 may be self-prepared or may be purchased directly from a third party. The source of the display substrate 11 is not limited in the present application.

Step 42: an encapsulating film layer 12 on a surface of the display substrate 11 is prepared.

The encapsulating film layer 12 may be prepared on the surface of the display substrate 11 by a thin film encapsulation technique. For example, the encapsulating film layer 12 may be formed by a combination of a plurality of layers of organic-inorganic films. The materials of the encapsulating film layer 12 may be a silicon nitride film, an aluminum oxide film, or the like. The materials and specific preparation mode of the encapsulating film are not limited in the present application.

Step 43: a partial region of a circumferential edge of the encapsulating film layer 12 is removed to form a sawtooth structure. As previously indicated, in order to meet different bending requirements for the flexible display devices, a shape of each sawtooth of the sawtooth structure is the same or different, a distance between adjacent two sawteeth is equal or unequal, the sawtooth of the sawtooth structure may be evenly distributed on a circumferential edge of the encapsulating film layer 12, or may be only distributed in a predetermined bending region.

It should be understood that a process that removes the encapsulating film layer 12 to form the sawtooth structure may adopt a process such as cutting, photolithography, etc., and the specific removing method is not limited in the present application. In addition, it should be understood that the sawteeth formed in the sawtooth structure may have a semicircle shape, a triangle shape, or a rectangle shape, etc., and the specific sawtooth structure is not limited in the present application.

In the flexible display device manufactured by the method for manufacturing a flexible display device provided by an embodiment of the present application, due to the existence of the sawtooth structure at the edge of the encapsulating film layer 12, when the flexible display device is bent, a concave-convex shape of the sawtooth structure of the edge of the encapsulating film layer 12 may play a role of dispersing bending stress, thereby avoiding fracture of the encapsulating film layer 12, and enhancing bending resistance performance of the flexible display device.

Figure 5:
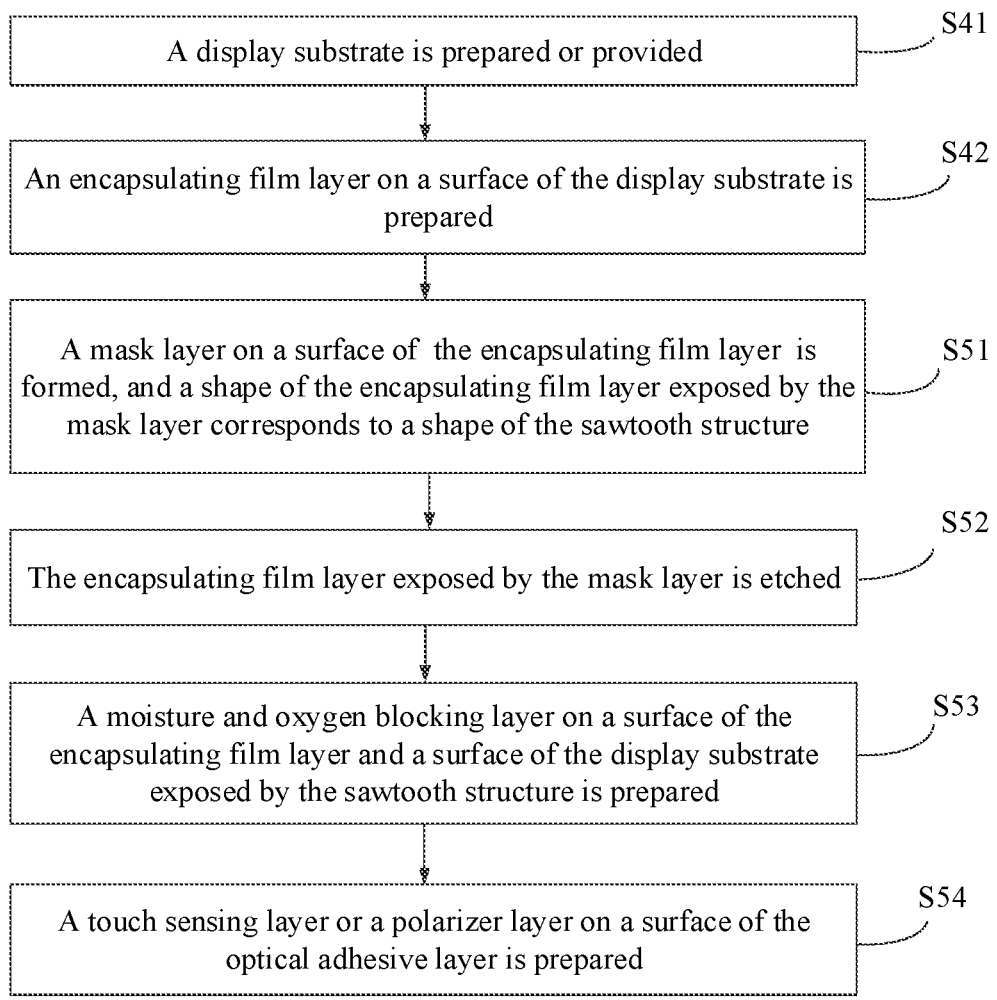
FIG. 5 is a schematic flow chart of a method for manufacturing a flexible display device according to an embodiment of the present application.

FIG. 5 is a schematic flow chart of a method for manufacturing a flexible display device according to an embodiment of the present application. As shown in FIG. 5, after the encapsulating film layer 12 is prepared on the surface of the display substrate 11 (step 42), the method further includes the following steps.

Step 51: a mask layer on the encapsulating film layer 12 is formed, and a shape of the encapsulating film layer 12 exposed by the mask layer corresponds to a shape of the sawtooth structure. That is, the pattern shape of the mask layer corresponds to the shape of the encapsulating film layer 12 with the sawtooth structure which is finally required.

Step 52: the encapsulating film layer 12 exposed by the mask layer is etched. After the encapsulating film layer 12 exposed by the mask layer is etched, the encapsulating film layer 12 with the sawtooth structure is obtained.

It should be understood that the etching process may be implemented by a chemical etching, an electronic etching, or the like. The specific etching method is not limited in the present application.

Step 53: a moisture and oxygen blocking layer on a surface of the encapsulating film layer 12 and a surface of the display substrate 11 exposed by the sawtooth structure is prepared. Since the moisture and oxygen blocking layer 32 is disposed on the surface of the encapsulating film layer 12 and covers the surface of the display substrate 11 exposed by the sawtooth structure of the circumferential edge of the encapsulating film layer 12. In this way, the moisture and oxygen blocking layer 32 is completely wrapped around periphery of the encapsulating film layer 12. Although the edge of the encapsulating film layer 12 includes the concave-convex sawtooth structure 121, only a convex portion of the sawtooth structure 121 may expose outside the moisture and oxygen blocking layer 32, which greatly reduces an area of the encapsulating film layer 12 exposed in the air compared with the prior art, thereby effectively blocking entry of the moisture and oxygen from a side, and improving the moisture and oxygen blocking performance of the flexible display device on the side.

It should be understood that the moisture and oxygen blocking layer 32 may be an optically transparent adhesive or other material having moisture and oxygen blocking performance. The material of the moisture and oxygen blocking layer 32 is not limited in the present application.

Step 54: a touch sensing layer 31a or a polarizer layer 31b is prepared on a surface of the optical adhesive layer. A horizontal cross sectional area of the touch sensing layer 31a or the polarizer layer 31b should be equal to a horizontal cross sectional area of the optical adhesive layer. In this case, the horizontal cross section of the optical adhesive layer refers to the surface of the optical adhesive layer that is in contact with the touch sensing layer 31a or the polarizer layer 31b. The touch sensing layer 31a is used to implement a touch operation of the flexible display device, and the polarizer layer 31b is used to absorb light in other directions of natural light, and only retain display light in a desired direction to pass through, which improves display quality.

It should be understood that the method for preparing the touch sensing layer 31a or the polarizer layer 31b may be a paste, a press, or the like. The specific method for preparing the touch sensing layer 31a or the polarizer layer 31b is not limited in the present application.

The above are only the preferred embodiments of the present application, and are not intended to limit the present application. Any modifications, equivalent replacements, etc. made within the spirit and principles of the present application should be included within the scope of the present application.

What is claimed is:

1. A flexible display device, comprising:
   a display substrate; and
   an encapsulating film layer, disposed on a surface of the display substrate, an edge of the encapsulating film layer comprising a concave-convex sawtooth structure, wherein the concave-convex sawtooth structure comprises a plurality of serrations arranged like the teeth of a saw, and wherein the plurality of serrations comprises more than three serrations on the edge of a side of the encapsulating film layer.

2. The flexible display device according to claim 1, wherein the sawtooth structure is located at a predetermined bending region of a circumferential edge of the encapsulating film layer; or, the sawtooth structure is distributed over an entire circumferential edge of the encapsulating film layer.

3. The flexible display device according to claim 2, further comprising a moisture and oxygen blocking layer, disposed on a surface of the encapsulating film layer, and covering the surface of the display substrate exposed by the sawtooth structure of the circumferential edge of the encapsulating film layer.

4. The flexible display device according to claim 3, wherein the moisture and oxygen blocking layer is a transparent optical adhesive layer.

5. The flexible display device according to claim 4, further comprising a touch sensing layer disposed on a surface of the optical adhesive layer; or, a polarizer layer disposed on a surface of the optical adhesive layer.

6. The flexible display device according to claim 5, wherein a horizontal cross sectional area of the touch sensing layer or the polarizer layer is equal to a horizontal cross sectional area of the optical adhesive layer.

7. The flexible display device according to claim 1, wherein a sawtooth in the sawtooth structure has a semi-circle shape, a triangle shape or a rectangle shape.

8. The flexible display device according to claim 1, wherein distances between the sawteeth in the sawtooth structure are equal.

9. The flexible display device according to claim 1, wherein the display substrate comprises an organic light emitting diode display substrate.

* * * * *